United States Patent [19]

Davis

[11] 4,384,219

[45] May 17, 1983

[54] VOLTAGE COMPARATOR HYSTERESIS CONTROL CIRCUIT

[75] Inventor: William F. Davis, Tempe, Ariz.

[73] Assignee: Motorola, Inc., Schaumburg, Ill.

[21] Appl. No.: 220,613

[22] Filed: Dec. 29, 1980

[51] Int. Cl.³ .................... H03K 5/24; H03K 5/153
[52] U.S. Cl. ................................. 307/362; 307/354; 307/359; 328/150
[58] Field of Search ............ 307/354, 358, 359, 360, 307/362, 350; 328/146, 150

[56] References Cited

U.S. PATENT DOCUMENTS 3,416,004 10/1968 Taylor .............................. 307/359
3,628,059 12/1971 Niu .................................. 307/359
4,259,601 3/1981 Stein ............................... 307/359

Primary Examiner—John Zazworsky
Attorney, Agent, or Firm—Vincent B. Ingrassia

[57] ABSTRACT

A voltage comparator includes a hysteresis control circuit which utilizes a level threshold device. The comparator has a first input coupled to an unknown voltage and a second input coupled to a threshold voltage. The hysteresis control circuit includes means for generating a hysteresis current which is caused to flow through a hysteresis resistor coupled to the second input when the threshold voltage exceeds the threshold of the level threshold device and the unknown voltage is greater than the voltage on the second input of the comparator.

17 Claims, 2 Drawing Figures

VOLTAGE COMPARATOR HYSTERESIS CONTROL CIRCUIT

BACKGROUND OF THE INVENTION

1. Field of the Invention

This invention relates generally to voltage comparator circuits and, more particularly, to a voltage comparator circuit utilizing a level threshold device for controlling the introduction of hysteresis into the circuit.

2. Description of the Prior Art

Voltage comparator circuits are widely used in the electronics field for converting analog voltages into digital representatives thereof. When an unknown analog input signal applied to one input of the comparator crosses a reference threshold voltage, the signal appearing at the comparator output is caused to change state. When the unknown signal is in the vicinity of the threshold voltage, noise may cause the voltage of the unknown signal to vary above and below the threshold voltage causing the comparator output to rapidly switch between two states. This is especially true, for example, in an automotive environment where large voltage transients are not uncommon.

One technique for reducing unwanted switching of the comparator output due to noise is to add hysteresis to the switching circuitry. The introduction of hysteresis into switching circuits for reducing the effect of noise signals and improving noise margin is well-known in the art. For example, co-pending application Ser. No. 31,554 filed Apr. 19, 1979 and assigned to the assignee of the present invention describes a dual slope analog-to-digital converter employing hysteresis. However, known comparator circuits employing hysteresis do not provide the user with complete flexibility with respect to controlling the amount of hysteresis introduced into the circuit including the total elimination of hysteresis.

SUMMARY OF THE INVENTION

It is an object of the present invention to provide an improved hysteresis control circuit.

It is a further object of the invention to provide a comparator including a hysteresis control circuit which provides the user complete control of the amount of hysteresis introduced into the circuit including the total elimination of hysteresis.

It is a still further object of the present invention to provide a comparator which utilizes a hysteresis control circuit including level threshold devices coupled to an input of the comparator such that no hysteresis is introduced into the circuit until the voltage applied to said comparator input exceeds the threshold voltage of said level threshold devices.

According to a first aspect of the invention there is provided a voltage comparator circuit for generating output transitions when an unknown voltage passes through a threshold voltage, comprising: comparing means having a first input coupled to said unknown voltage and a second input coupled to said threshold voltage and having an output at which said transitions occur; and hysteresis control means coupled to said second input and to said output for permitting a hysteresis voltage to be applied to said second input when said threshold voltage exceeds a predetermined value.

According to a further aspect of the invention there is provided a hysteresis control circuit for use with a voltage comparator having a first input coupled to a first voltage, a second input coupled to a second voltage, and having an output, said second input also coupled to impedance means, said hysteresis control circuit comprising: current generating means; and first means coupled to said second input, said impedance means, said output and to said current generating means for causing current to flow through said impedance means when said first voltage exceeds said second voltage and said second voltage exceeds a predetermined voltage.

The above and other objects, features and advantages of the present invention will be more clearly understood from the following detailed description taken in conjunction with the accompanying drawings, in which:

DESCRIPTION OF THE PREFERRED EMBODIMENT

Figure 1:
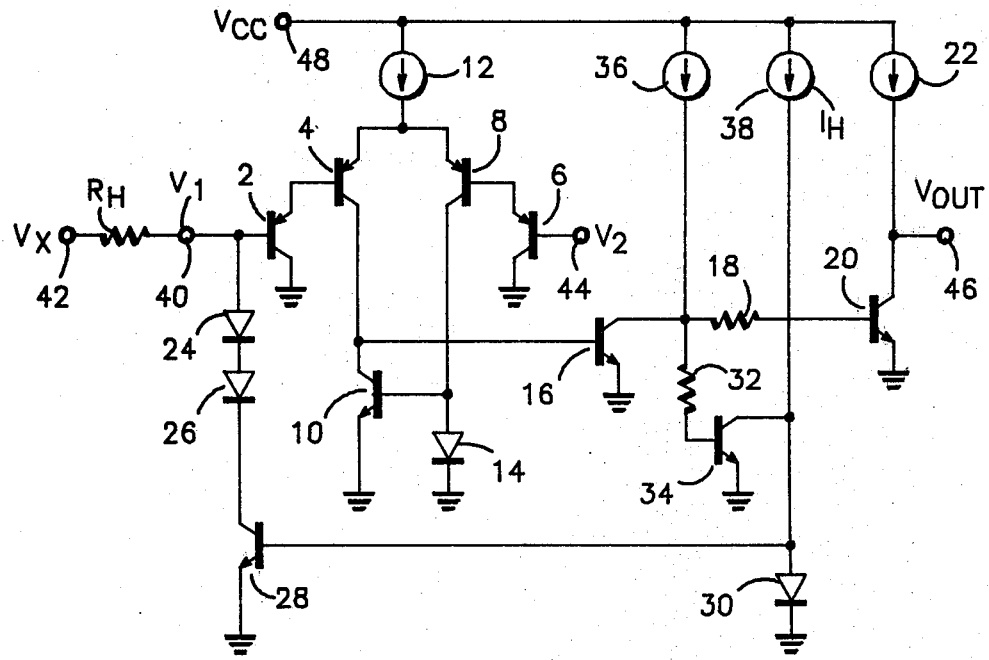
FIG. 1 is a schematic diagram of one embodiment of the inventive hysteresis control circuit.

FIG. 1 is a schematic diagram of the inventive voltage comparator hysteresis control circuit. The circuit includes a comparator comprising PNP transistors 2, 4, 6, and 8, NPN transistors 10 and 16, current source 12 and diode 14; an output circuit including resistor 18, NPN transistor 20 and current source 22; and a hysteresis control circuit comprising diodes 24, 26 and 30, NPN transistors 28 and 34, resistor 32 and current sources 36 and 38.

The comparator portion of the circuit includes first and second input terminals 40 and 44 which are coupled respectively to the base electrodes of transistors 2 and 6. The collector electrodes of transistors 2 and 6 are coupled to ground, and the emitter electrodes of transistors 2 and 6 are coupled respectively to the base electrodes of transistors 4 and 8. The emitter electrodes of transistors 4 and 8 are coupled together and to a current source 12 which is in turn coupled to a source of supply voltage $V_{CC}$ at terminal 48. The collector electrode of transistor 4 is coupled to the base electrode of transistor 16 which has a grounded emitter and to the collector electrode of transistor 10. The emitter of transistor 10 is coupled to ground and its base is coupled to the collector of transistor 8 and to the anode of diode 14, the cathode of which is grounded. Also coupled to terminal 40 is a hysteresis impedance $R_H$ of a desired value, or perhaps variable, which is in turn coupled to an external voltage $V_X$ at terminal 42. The external potential $V_X$ and impedance $R_H$ will be discussed in more detail hereinbelow.

Referring to the output portion of the circuit, resistor 18 is coupled between the collector of transistor 16 and the base of transistor 20 which has an emitter electrode coupled to ground. A current source 22 is coupled between the collector of transistor 20 and the source of supply voltage $V_{CC}$. The circuit output appears at terminal 46 which is coupled to the collector of output transistor 20.

Referring now to the hysteresis control portion of the circuit, diodes 24 and 26 which act as the above referred to level threshold devices are coupled between node 40 and the collector of transistor 28. The emitter of transistor 28 and the cathode of diode 30 are both coupled to ground while the base electrode of transistor 28 is coupled to the anode of diode 30. Transistor 34 has an emitter coupled to ground, a collector coupled to the anode of diode 30 and to the base of transistor 28, and a base electrode coupled, via resistor 32, to a current source 36 which is in turn coupled to the source of supply voltage $V_{CC}$. A hysteresis current source 38 ($I_H$) is coupled between the source of supply voltage $V_{CC}$ and the anode of diode 30.

Assume for the time being that current source 38 is generating a hysteresis current $I_H$ and that the voltage at terminal 40 ($V_1$) exceeds ground potential by at least two forward biased diode drops above ground. Also assume that the voltage appearing at terminal 44 ($V_2$) is greater than the voltage appearing at terminal 40 ($V_1$). This condition is illustrated in the left most portion of FIG. 2. Since transistors 2, 4, 6 and 8 are PNP transistors, transistors 2 and 4 will be rendered conductive while transistors 6 and 8 will be maintained in an off condition. Since transistor 8 is off, no current will flow through diode 14 and therefore no base drive will be supplied to transistor 10 thus maintaining transistor 10 in an off condition. Current supplied by current source 12 will flow through transistor 4 and be diverted to the base of transistor 16 turning it on. With transistor 16 on, a low voltage will be applied to the base of transistor 34 via resistor 32 and to the base of transistor 20 via resistor 18 thus maintaining both these transistors in an off condition. With transistor 20 off, a high voltage will appear at output terminal 46.

With transistor 34 off, current $I_H$ supplied by current source 38 will flow through diode 30 and base drive will be supplied to the base of transistor 28 turning it on. Since diode 30 and transistor 28 are implemented in a current mirror configuration, transistor 28 will try to draw a current $I_H$ through its collector. Since the voltage appearing at terminal 40 is greater than two diode voltage drops above ground, a current $I_H$ will flow through diodes 24 and 26. Furthermore, since terminal 40 ($V_1$) is coupled to node 42 ($V_X$) via resistor $R_H$, the voltage appearing at node 40 ($V_1$) will be equivalent to $V_X - I_H R_H$. Thus, the effective threshold voltage appearing at the input of the comparator will equal $V_X - I_H R_H$.

As the voltage at terminal 44 ($V_2$) passes through the voltage at terminal 40 ($V_1$) (shown at time $t_1$ in FIG. 2) transistors 2 and 4 will begin to turn off and transistors 6 and 8 will begin to turn on. With transistor 8 on, current will flow through diode 14 and to the base of transistor 10 turning it on. No current will flow to the base of transistor 16 turning it off. With transistor 16 off, current source 36 will supply drive current to the base electrode of transistors 20 and 34 turning both of them on. Thus, a low voltage will appear at output terminal 46. Furthermore, when transistor 34 turns on it will divert current $I_H$ through its collector such that no current flows through diode 30 thus eliminating base drive to transistor 28 maintaining it in an off state. With transistor 28 off, the hysteresis current $I_H$ does not flow through diodes 24 and 26, nor does it flow through the hysteresis impedance $R_H$. Thus, in computing the value of $V_1$ at terminal 40, the $I_H R_H$ term is no longer a factor and the voltage $V_1$ is equivalent to $V_X$. As a result, the effective threshold voltage appearing at the base of transistor 2 has increased to $V_X$ as is shown at time $t_1$ in FIG. 2.

Figure 2:
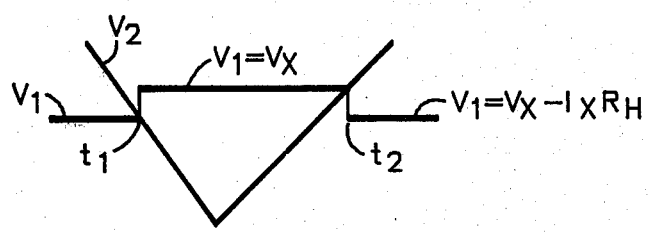
FIG. 2 illustrates in graphical form waveforms appearing at the input of a voltage comparator circuit employing the inventive hysteresis control circuitry which will aid in explaining the operation of the circuit shown in FIG. 1.

When the voltage $V_2$ at terminal 44 again passes through the threshold voltage ($V_1 = V_X$) shown at time $t_2$ in FIG. 2, transistors 6 and 8 will again turn off and transistors 2 and 4 will turn on. Since transistor 10 is now rendered nonconductive, base drive will again be supplied to transistor 16 turning it on causing a low voltage to again be applied to the base electrodes of transistors 20 and 34 maintaining them off. With transistor 20 off, a high voltage will again appear at output terminal 46. Furthermore, since transistor 34 is off, current will again be supplied to the base electrode of transistor 28 turning it on and drawing current $I_H$ through diodes 24 and 26 and hysteresis impedance $R_H$. The voltage appearing at the base of transistor 2 will now fall by an amount equivalent to $I_H R_H$ as is shown at time $t_2$ in FIG. 2.

Two things should now be apparent. First, since the hysteresis voltage is equal to $I_H R_H$, the amount of hysteresis may be controlled by varying the hysteresis impedance $R_H$. Second, if voltage $V_1$ appearing at terminal 40 is not sufficiently above ground to allow forward biased diodes 24 and 26 to conduct current $I_H$, no hysteresis current will flow through resistor $R_H$ even if the voltage at terminal 44 ($V_2$) is greater than the voltage appearing at node 40 ($V_1$). Therefore, by merely adjusting external potential $V_X$ at terminal 42 to a value less than two conducting forward biased diode voltage drops above ground, hysteresis may be entirely eliminated from the circuit without eliminating the hysteresis impedance $R_H$. Thus, the user has complete flexibility not only to adjust the amount of hysteresis utilized in the circuit from zero to $I_H R_H$ by adjusting the value of $R_H$, but also to totally eliminate the hysteresis, should this be desired, by lowering $V_X$ irrespective of the value of $R_H$.

The above description is given by way of example only. Changes in form and detail may be made by one skilled in the art without departing from the scope of the invention.

I claim:

1. A voltage comparator circuit for generating output transistions when an unknown voltage passes through a threshold voltage, comprising:
    comparing means having a first input coupled to said unknown voltage and a second input coupled to said threshold voltage and having an output at which said transitions occur: and
    hysteresis control means coupled to said second input and to said output for permitting a hysteresis voltage to be applied to said second input only when said unknown voltage exceeds said threshold voltage and said threshold voltage exceeds a predetermined value, said hysteresis voltage being eliminated when said threshold voltage does not exceed said predetermined value.

2. A voltage comparator circuit according to claim 1 wherein said hysteresis control means includes at least one level threshold device coupled to said second input for setting said predetermined value.

3. A voltage comparator circuit according to claim 2 wherein said at least one level threshold device is a diode.

4. A voltage comparator circuit according to claim 2 further comprising impedance means coupled to said second input.

5. A voltage comparator circuit according to claim 4 wherein said hysteresis control means further includes:
    current generating means; and
    first switching means coupled to said current generating means and to said at least one level threshold device for causing a hysteresis current to flow through said at least one level threshold device and said impedance means when said threshold voltage exceeds said predetermined value and said unknown voltage exceeds said threshold voltage.

6. A voltage comparator circuit according to claim 5 wherein said hysteresis control means further includes second switching means coupled to said output and to said first switching means for turning said first switching means off when said unknown voltage is less than said threshold voltage to prevent said hysteresis current from flowing through said impedance means.

7. A voltage comparator circuit according to claim 6 wherein said first switching means comprises a first transistor having a base coupled to said current generating means, an emitter coupled to ground and a collector coupled to said at least one level threshold device.

8. A voltage comparator circuit according to claim 7 wherein said second switching means comprises a second transistor having a base coupled to said output, an emitter coupled to ground and a collector coupled to said current generating means for diverting current away from said first transistor.

9. A voltage comparator circuit according to claim 8 wherein said at least one level threshold device comprises first and second series connected diodes.

10. A voltage comparator circuit according to claim 9 wherein said impedance means is a resistor.

11. A hysteresis control circuit for use with a voltage comparator having a first input coupled to a first voltage, a second input coupled to a second voltage, and having an output, said second input also coupled to impedance means, said hysteresis control circuit comprising:

current generating means; and first means coupled to said second input, said impedance means, said output and to said current generating means for causing current to flow through said impedance means when said first voltage exceeds said second voltage and said second voltage exceeds a predetermined voltage different from said first voltage, said current being prevented if said second voltage does not exceed said predetermined voltage.

12. A hysteresis control circuit according to claim 11 wherein said first means comprises:

at least one level threshold device for establishing said predetermined voltage, said at least one level threshold device being coupled to said second input;

current generating means;

first switching means coupled to said current generating means and said at least one level threshold device for causing a hysteresis current to flow through said at least one threshold device and said impedance means when said first voltage is greater than said second voltage; and second switching means coupled to said output and to said first switching means for turning said first switching means off when said first voltage is less than said second voltage.

13. A hysteresis control circuit according to claim 12 wherein said at least one level threshold device comprises at least one diode having an anode coupled to said second input and to said impedance means and having a cathode coupled to said first switching means.

14. A hysteresis control circuit according to claim 13 wherein said first switching means comprises a first transistor having a base coupled to said current generating means, an emitter coupled to ground and a collector coupled to said at least one level threshold device.

15. A hysteresis control circuit according to claim 14 wherein said second switching means comprises a second transistor having a base coupled to said output, an emitter coupled to ground and a collector coupled to said current generating means for diverting current away from said first transistor.

16. A hysteresis control circuit according to claim 15 wherein said impedance means is a resistor.

17. A voltage comparator circuit for generating output transitions when a first voltage passes through a second voltage, comprising:

comparing means having a first input coupled to said first voltage and a second input coupled to said second voltage and having an output at which said transitions occur; and hysteresis control means coupled to said second input and to said output for permitting a hysteresis voltage to be applied to said second input when said second voltage exceeds a predetermined value.

* * * * *

UNITED STATES PATENT AND TRADEMARK OFFICE
CERTIFICATE OF CORRECTION

PATENT NO. : 4,384,219
DATED : May 17, 1983
INVENTOR(S) : William F. Davis

It is certified that error appears in the above—identified patent and that said Letters Patent are hereby corrected as shown below:

Column 4, claim 1, line 2, change "transistions"

to --transitions--.

Signed and Sealed this

Twentieth Day of March 1984

[SEAL]

Attest:

Attesting Officer

GERALD J. MOSSINGHOFF

Commissioner of Patents and Trademarks